United States Patent [19]
Darmon et al.

[11] Patent Number: 5,173,902
[45] Date of Patent: Dec. 22, 1992

[54] METHOD OF ESTABLISHING AN INVERSE PILOT-SEQUENCE FOR DEINTERLEAVING AS USED IN DIGITAL TRANSMISSION

[75] Inventors: Marc Darmon; Philippe Sadot, both of Paris, France

[73] Assignee: Alcatel Transmission par Faisceaux Hertziens, Levallois Perret Cedex, France

[21] Appl. No.: 874,221

[22] Filed: Apr. 27, 1992

Related U.S. Application Data

[63] Continuation of Ser. No. 438,127, Nov. 20, 1989.

[30] Foreign Application Priority Data

Nov. 25, 1988 [FR] France .................... 88 15421

[51] Int. Cl.⁵ ............................................. G06F 11/00
[52] U.S. Cl. ........................................ 371/2.1; 371/2.2
[58] Field of Search ................ 371/2.1, 2.2.47.1, 38.1, 371/39.1

[56] References Cited

U.S. PATENT DOCUMENTS

| | | | |
|---|---|---|---|
| 3,988,538 | 10/1976 | Patten | 371/2.1 |
| 4,394,642 | 7/1983 | Currie et al. | 371/2.1 |
| 4,547,887 | 10/1985 | Mui . | |
| 4,723,246 | 2/1988 | Weldon, Jr. | 371/2.1 |
| 4,901,319 | 2/1990 | Ross | 371/2.1 |

FOREIGN PATENT DOCUMENTS 02322043 8/1987 European Pat. Off. .

OTHER PUBLICATIONS

Clark and Cain: "Error Correcting Coding", 1981, Plenum Press, New York, pp. 349-352.

Primary Examiner—Robert W. Beausoliel
Assistant Examiner—Phung My Chung
Attorney, Agent, or Firm—Sughrue, Mion, Zinn, Macpeak & Seas

[57] ABSTRACT

A method of establishing an inverse pilot sequence for deinterleaving as used in digital transmission, with the interleaving being performed by means of a transmit register and a pilot sequence. Each portion (2 5 1 4 3 6) of the inverse pilot sequence is obtained from the preceding portion (3 1 6 5 4 2) of the inverse pilot sequence and from the two corresponding portions (2 6 1 5 4 3, 4 1 3 6 5 2) of the pilot sequence, with the k-th element of the N-th portion of the inverse pilot sequence being determined by observing the rank of the k-th element in the (N−1)-th portion of the pilot sequence in the N-th portion of the pilot sequence, and then in selecting the element to be found at this rank in the (N−1)-th portion of the inverse pilot sequence.

2 Claims, 2 Drawing Sheets

METHOD OF ESTABLISHING AN INVERSE PILOT-SEQUENCE FOR DEINTERLEAVING AS USED IN DIGITAL TRANSMISSION

This is a continuation of application Ser. No. 07/438,127 filed Nov. 20, 1989.

The present invention relates to a method of establishing an inverse pilot sequence for deinterleaving as used in digital transmission.

BACKGROUND OF THE INVENTION

When words to be transmitted are encoded by an error correcting code, a limited number of erroneous symbols can be corrected. However, if a major part of a word is wrong, then there is no hope of being able to regenerate the word. In order to mitigate this drawback, one known technique consists in interleaving symbols such that the symbols of a given initial code word are spaced apart and a "packet" of errors will only affect one or few of the symbols in each of several different words as observed after deinterleaving.

There are numerous ways in which interleaving may be performed, but the present invention relates more particularly to interleaving generated by a pilot sequence of addresses, as follows:

Symbols are written to and read from a vector of given size. The addresses of the pilot sequence define those locations in a vector from which the next symbol to be transmitted is to be read or to which the following symbol is to be written, which symbol will be transmitted in its turn, when the same address reappears in the pilot sequence.

By way of concrete example, assume that a vector contains six symbols and that it is desired to transmit the following sequence: a b c d e f g h i j k l ... . The pilot sequence is a sequence of sixes. Within each six, each of the six addresses 1, 2, 3, 4, 5, and 6 is selected once, and once only.

Assume that the pilot sequence begins as follows, for example:

2 6 1 5 4 3   4 1 3 6 5 2   4 2 1 6 5 3 ...

and assume that the first symbols a to f are already in register embodying said vector.

The register is thus filled as follows:

a b c d e f

In this case, the first of the following symbols, i.e., symbol g, takes the second place in the register, and the symbol b previously in that register location is transmitted. The second following symbol (h) replaces the sixth symbol (i.e. f is transmitted and replaced by h). The next symbol (i) takes the first place (a is transmitted and replaced by i). Then the next symbol (j) takes the fifth place (e is transmitted and replaced by j). Then the next symbol (k) takes the fourth place in the register (d is transmitted and replaced by k). And finally the twelfth symbol (l) takes the third place (c is transmitted and replaced by l).

At this moment, the register contains the seventh through twelfth original symbols in the following order:

i g l k j h

The next, i.e. thirteenth, symbol (m) is to be put in the register in the fourth position, since four is the seventh digit in the pilot sequence. Since k is already in this location, k is transmitted and replaced by m.

The fourteenth symbol (n) is to be put in the first position which already contains i: i is therefore transmitted and replaced by n, and so on. The sequence of symbols actually transmitted (i.e. the "channel sequence") when interleaving is performed using the above pilot sequence, finally ends up as follows:

b f a e d c k i l h j g ...

In order to recover the initial train of symbols at the receiving end, it is necessary to perform deinterleaving on the same principles, but by means of an "inverse pilot sequence" derived from the pilot sequence. The inverse pilot sequence is unique, but several methods may be devised for obtaining it.

A simple method of obtaining the inverse pilot sequence from a pilot sequence is the following:

The first n symbols of the above-defined channel sequence are written into a receive vector or register of the same size as that used on transmission. In the above example, n is equal to 6, so the first six symbols of the channel sequence are written into the receive register.

The first element in the inverse pilot sequence is thus the address in this register of the smallest element in the register (where the term "smallest element" is used to mean the symbol having the lowest order number in the sequence of symbols corresponding to the initial encoding prior to interleaving for transmission).

This smallest element is replaced by the following symbol from the channel sequence, and the second element of the inverse pilot sequence is the address of the smallest element in the register after the above change, and so on, ... .

Thus, in order to obtain each element of the inverse pilot sequence, it is necessary to scan the receive register each time in order to find the smallest element. When symbol interleaving is performed, not on registers having six elements only, but on registers of about 10,000 symbols, as is often the case, it then becomes necessary in order to find each series of 10,000 addresses in the inverse pilot sequence to scan through all 10,000 elements of the register 10,000 times and to order them each time in order to find the smallest element, and this suffers from the drawback of being a particularly lengthy procedure.

The invention seeks to remedy this drawback and, by way of example, it makes it possible to divide the time required for calculating the inverse pilot sequence by several thousand.

SUMMARY OF THE INVENTION

The method consists in dividing the pilot sequence and the inverse pilot sequence into successive portions each having the same size as the vector or register used on transmission or reception, in obtaining each portion of the inverse pilot sequence from the preceding portion of said inverse pilot sequence and from the two corresponding portions of the pilot sequence as follows: the k-th element of the N-th portion of the inverse pilot sequence is determined by observing the rank of the k-th element of the (N−1)-th portion of the pilot sequence in the N-th portion of the pilot sequence, and then selecting the element to be found at this rank in the (N−1)-th portion of the inverse pilot sequence. As for the first portion of the inverse pilot sequence, it is determined by some other method, e.g. the method described above and consisting in writing the first elements of the channel sequence in order in the receive register and in specifying each element of the inverse pilot sequence as being the address in said register of the smallest element of the register and then replacing said smallest element in the register with the following symbol of the channel sequence.

BRIEF DESCRIPTION OF THE DRAWING

The invention will be more clearly understood from the following description in conjunction with the accompanying drawing, wherein.

DETAILED DESCRIPTION OF THE INVENTION

The following is a description, with reference to the accompanying Figure, of one example of a technique whereby an inverse pilot signal sequence can be derived according to the method of the present invention.

This example uses the same data given above, such that the transmit and receive registers are each capable of containing six symbols. The coded series of symbols to be transmitted is the following: a b c d e f g h i j k l .... The pilot sequence is the following series of sixes:

2 6 1 5 4 3   4 1 3 6 5 2 ...

and the channel sequence, as determined above, is the following:

b f a e d c   k i l h j g ...

The example will be described with reference to FIGS. 1 and 2.

The first six of the inverse pilot sequence is initially obtained by the above-described method which is simple but lengthy.

Figure 2:
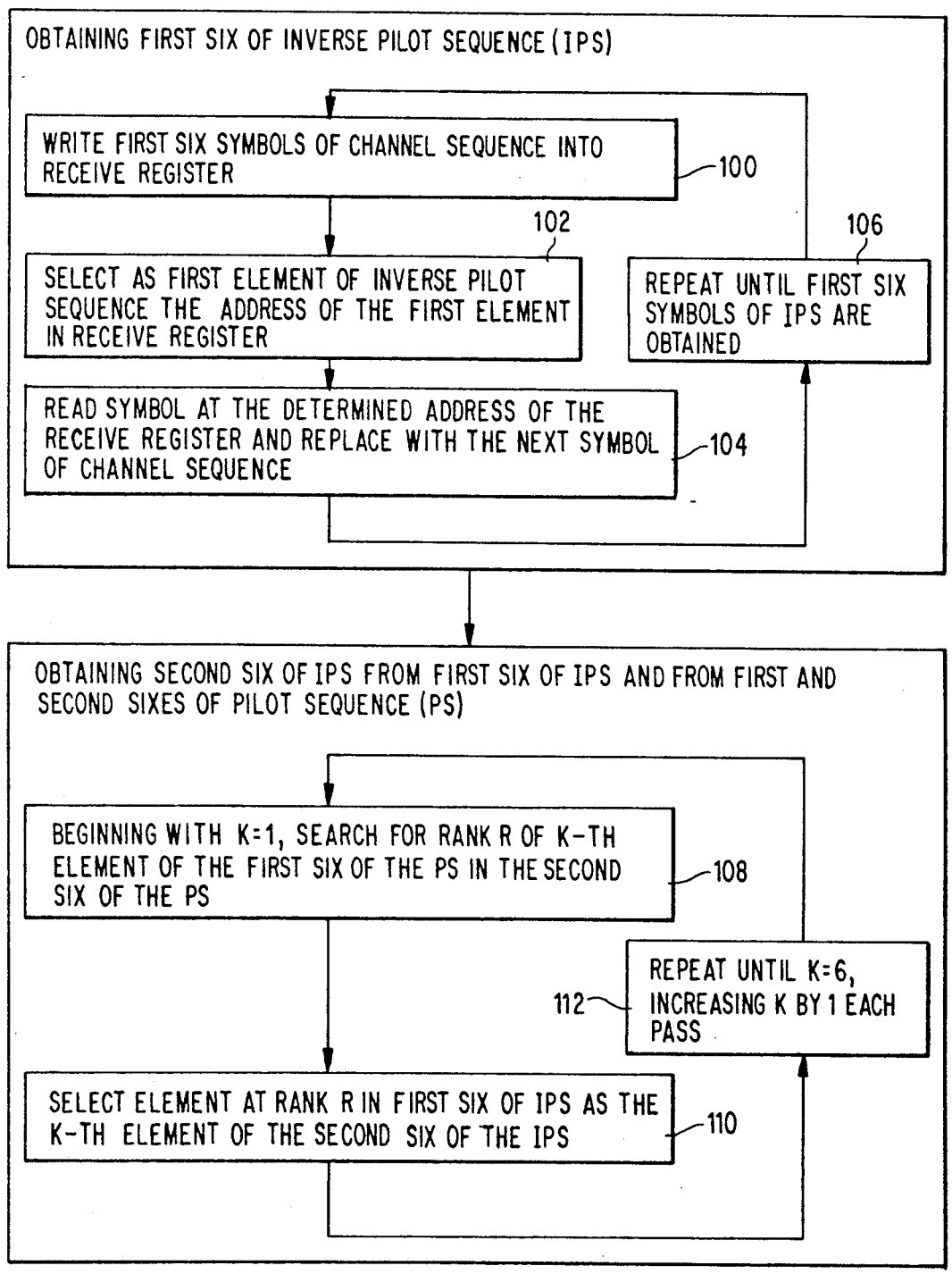
FIG. 2 illustrates a flow chart for explaining the method of the present invention.

The first six symbols:

b f a e d c of the channel sequence are thus initially written into the receive register 10, as shown at step 100 in FIG. 2. As shown at step 102 in FIG. 2, the first element of the inverse pilot sequence is thus the address of the smallest element, i.e. a, in said register, i.e. the address 3.

a is read and replaced by the following symbol in the channel sequence, i.e. by k as shown at step 104 in FIG. 2.

Figure 1:
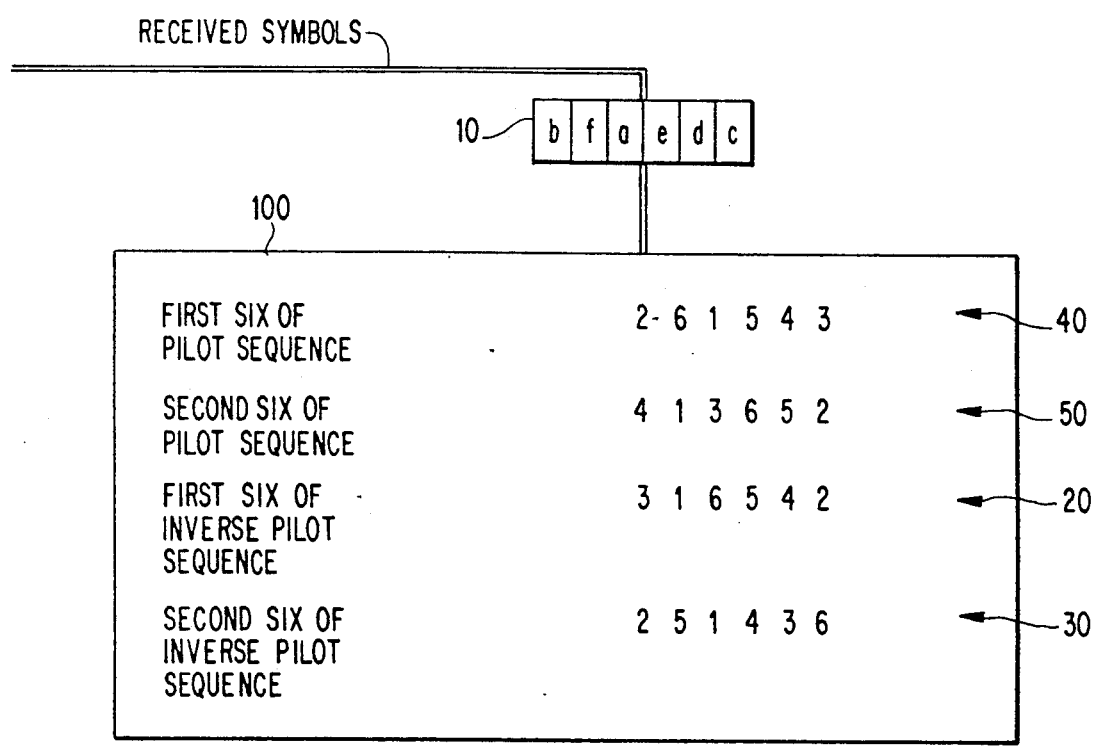
FIG. 1 illustrates a system for performing the method of the present invention.

By repeating this method six times over in accordance with step 106 in FIG. 2, the following first six elements of the inverse pilot sequence are obtained as shown at 20 in FIG. 1 i.e.:

3 1 6 5 4 2

The method of the invention can then be used for calculating the following elements of this inverse pilot sequence shown at 30 in FIG. 1 in accordance with the steps shown in the lower half of FIG. 2.

In order to obtain the seventh element of the inverse pilot sequence, the processing means 100 examines the first six elements (first portion) of the of the pilot sequence, shown at 40 in FIG. 1, and the second six elements (second portion) of the pilot sequence, shown at 50 in FIG. 1, and a search is made for the rank of the first element of the first six of the pilot sequence in the second six of the pilot sequence, in accordance with step 108 in FIG. 2. This first element of the first six of the pilot sequence shown at 40 in FIG. 1 is 2, and 2 has the sixth place in the second six. Consequently, the first element of the second six in the inverse pilot sequence shown at 30 in FIG. 1 is taken as being the element at rank 6 i.e. in the sixth position, in the first six of the inverse pilot sequence shown at 20 in FIG. 1, i.e., 2, in accordance with step 110 in FIG. 2. Thus, the element 2 becomes the first element (the "k-th" element, where k=1) of the second portion (the "N-th" portion, where N=2) of the inverse pilot sequence.

This is stored in the first position of the register 30 as the first element (the "k-th" element, where k=1) of the second portion (the "N-th" portion, where N=2) of the inverse pilot sequence. The eighth element of the inverse pilot sequence is determined in the first portion of the same way: the second element of the pilot sequence shown at 40 in FIG. 1 is 6, and 6 is the fourth element in the second portion (second six) of said pilot sequence shown at 50 in FIG. 1; the looked-for eighth element is thus the fourth element of the first six of the inverse pilot sequence shown at 20 in FIG. 1, i.e., 5.

The procedure continues in this way until the entire pilot sequence has been used up. The derivation of the eighth and subsequent elements of the inverse pilot sequence is illustrated at step 112 in FIG. 2. This provides the following inverse pilot sequence:

3 1 6 5 4 2  2 5 1 4 3 6 ...

It is easily verified that this inverse pilot sequence is the same as that which would have been obtained using the first above-described method, which although simpler is much more lengthy.

Naturally, the invention is not limited to the example described above. In particular, the first portion (the first six in the above example) of the inverse pilot sequence could be obtained by a method other than the very simple method descried above. The advantage of the method of the present invention lies in its speed which makes it possible to obtain an inverse pilot sequence in real time. It thus becomes possible to perform pseudorandom or other interleaving in real time using a pilot sequence also calculated in real time, while operating at a data rate of interest.

We claim:

1. A method of establishing a deinterleaving inverse pilot sequence, for use in digital transmission of a plurality of symbols wherein said symbols are transmitted with interleaving in accordance with a pilot sequence, with the interleaving using a transmit storage means of a predetermined size from which symbols are read successively for transmission over a channel in a channel sequence order and into which subsequent ones of said plurality of symbols are written successively in accordance with said the pilot sequence, and wherein said symbols are received with deinterleaving using a receive storage means of said predetermined size and from which symbols received from the channel are read in succession and into which subsequent ones of said symbols received from said channel are written in succession in accordance with said inverse pilot sequence, wherein the method of establishing a deinterleaving inverse pilot sequence comprises:

dividing the pilot sequence and the inverse pilot sequence into successive portions with each portion containing the same set of elements and with said set of elements having a number of elements corresponding to said predetermined size of said transmit or receive storage means, said elements occurring in a particular sequence within each portion, and each element in a given portion being associated with a rank corresponding to the order of occurrence of that element in the particular sequence of said given portion, determining a current portion of the inverse pilot sequence from a preceding portion of said inverse pilot sequence and from successive first and second portions of the pilot sequence corresponding to said current and previous portions of said inverse pilot sequence, said step of determining a current portion of said inverse pilot signal sequence comprising the steps of determining a rank of a k-th element of the first portion of the pilot sequence in the second portion of said pilot sequence, where k is an integer corresponding to the rank of a k-th element in said current portion of said inverse pilot sequence, and selecting as the k-th element of the current portion of the inverse pilot sequence the element in the previous portion of the inverse pilot sequence having the same rank as the rank of said k-th element of the first portion of the pilot sequence in the second portion of said pilot sequence.

2. A method according to claim 1, wherein a first portion of the inverse pilot sequence is determined by:

writing first ones of the symbols received from said channel into the receive storage means in channel sequence order as determined by the pilot sequence, selecting as each element of the inverse pilot sequence an address in said receive storage means of a smallest element in the receive storage means, while simultaneously replacing each smallest element in said receive storage means by a next following symbol received from the channel.

* * * * *